(12) United States Patent
Mueller

(10) Patent No.: US 6,754,606 B2
(45) Date of Patent: Jun. 22, 2004

(54) METHOD OF PROTECTING A CIRCUIT ARRANGEMENT FOR PROCESSING DATA

(75) Inventor: Detlef Mueller, Barsbuettel (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 10/014,857

(22) Filed: Nov. 13, 2001

(65) Prior Publication Data

US 2002/0087284 A1 Jul. 4, 2002

(30) Foreign Application Priority Data

Nov. 15, 2000 (DE) .......................................... 100 56 591

(51) Int. Cl.$^7$ .............................................. G01R 27/28
(52) U.S. Cl. ....................................... 702/117; 324/500
(58) Field of Search ............................. 702/117, 33–35, 702/57–59, 81, 84, 182–184, 185; 324/500, 527, 763; 700/8, 9, 21, 26, 79, 117

*Primary Examiner*—Marc S. Hoff
*Assistant Examiner*—Edward Raymond
(74) *Attorney, Agent, or Firm*—Kevin Simons

(57) ABSTRACT

A method of protecting a circuit arrangement for processing data, particularly a microprocessor, preferably a smart card controller, in which circuit arrangement, during and/or at the end of manufacturing this circuit arrangement and for the purpose of manufacturing control scan tests, a shift register chain is formed by combining memory cells of the circuit arrangement, preferably memory cells formed as flip-flops, in a predetermined configuration from these memory cells, by means of this shift register chain and/or another shift register chain formed in the circuit arrangement, arbitrary states are generated in the memory cells of the circuit arrangement and evaluated in a predetermined way for testing the functional capability of the memory cells of the circuit arrangement loaded with these states, after ending the manufacturing control scan test, the shift register chain is made unusable.

By rendering a shift register chain in data-processing circuit arrangements unusable, particularly in microprocessors and preferably smart card controllers, after testing, i.e. after performing the production test(s) (i.e. the manufacturing control), it will be impossible to load undefined states via the shift register chain into the circuit arrangement and attack the security functions of the circuit arrangement in this way.

3 Claims, No Drawings

METHOD OF PROTECTING A CIRCUIT ARRANGEMENT FOR PROCESSING DATA

The invention relates to a method of protecting a circuit arrangement for processing data.

In circuit arrangements for processing data, particularly in microprocessors, for example, those used in chip cards—smart card controllers—scan tests are increasingly performed during the manufacturing control stage—the production tests—in addition to self-tests by a read-only memory integrated preferably in the microprocessor, also referred to as test ROM, so as to protect these circuit arrangements from errors. In accordance with known methods, arbitrary states can be established by means of a shift register chain in the memory cells, formed as flip-flops, of the data-processing circuit arrangement, thus particularly in microprocessors or preferably smart card controllers. This means that after activation of the scan test mode, the shift register chain is completely available and allows loading of arbitrary states in the flip-flops forming part of the shift register chain.

These states are specifically evaluated for testing the functional capability of the memory cells of the circuit arrangement loaded with these states.

However, it appears that this operating state can also be restored after the circuit arrangement has been manufactured for a specific operation and that this is not acceptable for reasons of security, because the security functions of the circuit arrangement can then be attacked in this way.

It is an object of the invention to provide a method by which such attacks of the security functions of the circuit arrangement are made impossible.

According to the invention, this object is solved by a method of protecting a circuit arrangement for processing data, particularly a microprocessor, preferably a smart card controller, in which circuit arrangement, during and/or at the end of manufacturing this circuit arrangement and for the purpose of manufacturing control scan tests,

- a shift register chain is formed by combining memory cells of the circuit arrangement, preferably memory cells formed as flip-flops, in a predetermined configuration from these memory cells,
- by means of this shift register chain and/or another shift register chain formed in the circuit arrangement, arbitrary states are generated in the memory cells of the circuit arrangement and evaluated in a predetermined way for testing the functional capability of the memory cells of the circuit arrangement loaded with these states,
- after ending the manufacturing control scan test, the shift register chain is made unusable.

By rendering a shift register chain in data-processing circuit arrangements unusable, particularly in microprocessors and preferably in smart card controllers after testing, i.e. after performing the production test(s) (i.e. the manufacturing control), it will be impossible to load undefined states via the shift register chain into the circuit arrangement and attack the security functions of the circuit arrangement in this way. This advantage is accompanied by a minor increase of the number of components for the circuit arrangement, because additional logic components, particularly fuses and gates will be required for performing the method according to the invention.

In an embodiment of the method according to the invention, the scan test is controlled by means of a test mode decoder which can be switched on and off by means of a programmable switching device, referred to as fuse, and the scan test in the test mode decoder can only be selected when the fuse is deactivated, with which scan test the shift register chain is made unusable by activating the fuse.

In a further embodiment of the method according to the invention, the shift register chain is interrupted at a majority of locations after ending the manufacturing control scan test(s) by means of fuses preferably formed as EEPROM fuses.

As an additional protective method, the shift register chain is thus interrupted at many locations by means of the EEPROM fuse so that, even when bypassing the test mode decoder, the shift register chain is no longer usable. This makes it impossible to load undefined states via the shift register chain into the circuit arrangement, for example a smart card controller.

What is claimed is:

1. A method of protecting a circuit arrangement for processing data in which circuit arrangement, during and/or at the end of manufacturing this circuit arrangement and for the purpose of manufacturing control scan tests,

- a shift register chain is formed by combining memory cells of the circuit arrangement, preferably memory cells formed as flip-flops, in a predetermined configuration from these memory cells,
- by means of this shift register chain and/or another shift register chain formed in the circuit arrangement, arbitrary states are generated in the memory cells of the circuit arrangement and evaluated in a predetermined way for testing the functional capability of the memory cells of the circuit arrangement loaded with these states,
- after ending the manufacturing control scan test, the shift register chain is made unusable.

2. A method as claimed in claim 1, characterized in that the scan test is controlled by means of a test mode decoder which can be switched on and off by means of a programmable switching device, referred to as fuse, and the scan test in the test mode decoder can only be selected when the fuse is deactivated, with which scan test the shift register chain is made unusable by activating the fuse.

3. A method as claimed in claim 1 or 2, characterized in that the shift register chain is interrupted at a majority of locations after ending the manufacturing control scan test(s) by means of fuses preferably formed as EEPROM fuses.

* * * * *